US012153111B2

(12) United States Patent
Vasanawala et al.

(10) Patent No.: US 12,153,111 B2
(45) Date of Patent: Nov. 26, 2024

(54) DEEP LEARNING-BASED WATER-FAT SEPARATION FROM DUAL-ECHO CHEMICAL SHIFT ENCODED IMAGING

(71) Applicant: The Board of Trustees of the Leland Stanford Junior University, Stanford, CA (US)

(72) Inventors: Shreyas S. Vasanawala, Stanford, CA (US); Yan Wu, Mountain View, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 93 days.

(21) Appl. No.: 18/102,249

(22) Filed: Jan. 27, 2023

(65) Prior Publication Data

US 2023/0236272 A1     Jul. 27, 2023

Related U.S. Application Data

(60) Provisional application No. 63/303,838, filed on Jan. 27, 2022.

(51) Int. Cl.
| | |
|---|---|
| *G01V 3/00* | (2006.01) |
| *G01R 33/48* | (2006.01) |
| *G01R 33/485* | (2006.01) |
| *G06T 11/00* | (2006.01) |

(52) U.S. Cl.
CPC ....... *G01R 33/485* (2013.01); *G01R 33/4828* (2013.01); *G06T 11/008* (2013.01)

(58) Field of Classification Search
CPC .............. G01R 33/3415; G01R 33/543; G01R 33/5659; G01R 33/36; A61B 5/055

USPC ......................................................... 324/309
See application file for complete search history.

(56) References Cited

U.S. PATENT DOCUMENTS 10,748,309 B2 *   8/2020   Seevinck ........... G01R 33/4816

FOREIGN PATENT DOCUMENTS

AU       2018221015 A1 *   8/2019   ........... G01R 33/485

OTHER PUBLICATIONS

Zhang, Tao, et al. "Resolving phase ambiguity in dual-echo dixon imaging using a projected power method." Magnetic resonance in medicine 77.5 (2017): 2066-2076.
Yu, et al. Multiecho reconstruction for simultaneous water-fat decomposition and T2* estimation. J Magn Reson Imaging 2007;26(4):1153-1161.

(Continued)

*Primary Examiner* — Walter L Lindsay, Jr.
*Assistant Examiner* — Frederick Wenderoth
(74) *Attorney, Agent, or Firm* — LUMEN PATENT FIRM

(57) ABSTRACT

A method for magnetic resonance imaging performs chemical shift encoded imaging to produce complex dual-echo images which are then applied (with imaging parameters) as input to a deep neural network to produce as output water-only and fat-only images. The deep neural network can be trained with ground truth water/fat images derived from chemical shift encoded images using a conventional water-fat separation algorithm such as projected power approach, IDEAL, or VARPRO. The chemical shift encoded imaging comprises performing an image acquisition with the MRI scanner via a spoiled-gradient echo sequence or a spin-echo sequence.

9 Claims, 15 Drawing Sheets

(56) References Cited

OTHER PUBLICATIONS

Hernando et al., Robust water/fat separation in the presence of large field inhomogeneities using a graph cut algorithm. Magn Reson Med 2010;63:79-90.

Wu, et al. "Incorporating prior knowledge via volumetric deep residual network to optimize the reconstruction of sparsely sampled MRI." Magnetic resonance imaging 66 (2020): 93-103.

Wu, et al. "Deriving new soft tissue contrasts from conventional MR images using deep learning." Magnetic Resonance Imaging 74 (2020): 121-127.

Johnson, et al. "Perceptual losses for real-time style transfer and super-resolution." European conference on computer vision. Springer, Cham, 2016.

Wu et al., Deep Learning-Based Water-Fat Separation from Dual-Echo Chemical Shift-Encoded Imaging. Bioengineering (Basel). Oct. 19, 2022;9(10):579.

Wu et al. Self-attention convolutional neural network for improved MR image reconstruction. Information sciences. Jul. 1, 2019;490:317-28.

\* cited by examiner

DEEP LEARNING-BASED WATER-FAT SEPARATION FROM DUAL-ECHO CHEMICAL SHIFT ENCODED IMAGING

CROSS-REFERENCE TO RELATED APPLICATIONS

This application claims priority from U.S. Provisional Patent Application 63/303,838 filed Jan. 27, 2022, which is incorporated herein by reference.

STATEMENT OF FEDERALLY SPONSORED RESEARCH

This invention was made with Government support under contract EB009690, EB026136, and EB029427 awarded by the National Institutes of Health. The Government has certain rights in the invention.

FIELD OF THE INVENTION

The present invention relates generally to medical imaging. More specifically, it relates to magnetic resonance (MR) imaging techniques.

BACKGROUND OF THE INVENTION

Chemical shift encoded MR imaging is an effective water-fat separation approach. However, current chemical shift encoded methods have some limitations: (1) water/fat swaps caused by inaccurate phase estimation due to $B_0$ inhomogeneity (e.g., off-isocenter imaging); (2) severe artifacts induced by metallic implants (due to dramatic change of local magnetic field); (3) long computational time of various optimized algorithms that aim to overcome swaps; and (4) long acquisition time (in case of three- or more multi-echo chemical shift encoded imaging).

SUMMARY OF THE INVENTION

Herein is disclosed a deep learning-based method that generates water and fat images from dual-echo chemical shift encoded images with high robustness and near-instant processing time. It promises to accomplish the followings (1) eliminate global water/fat swaps (2) mitigate local water/fat swaps; (3) compensate for severe artifacts induced by metallic implants; (4) significantly reduce computational time; (5) support the use of flexible imaging parameters in radiological imaging; specifically in water-fat separation, the use of flexible echo times (TEs) facilitates more efficient acquisition of high-resolution dual-echo MR images.

The deep learning-based method reduces the data processing time to near instant, which is critical for some clinical applications, such as contrast-enhanced imaging (since technologists must rapidly evaluate the images for adequacy).

In previous deep learning-based water-fat separation methods, water and fat images are derived from a large number of multi-echo images. In the current method, water and fat images are separated from dual-echo images, which makes the proposed method more practically useful (due to its high data acquisition efficiency). Particularly in abdominal imaging, where dual-echo imaging is often an essential part of the clinical imaging protocol, the proposed method may support water-fat separation without acquisition of an additional echo.

In conventional dual-echo imaging, the prescription of a high in-plane resolution or a low receiver bandwidth may force the echo times (TEs) to deviate from their minimal optimal values. To avoid incomplete water-fat separation, the TEs were usually extended to next optimal values, resulting in an elongated scan. To facilitate more efficient acquisition of high-resolution dual-echo images, we develop a mechanism (including imaging parameters as an additional input to the deep learning-based water-fat separation model) that supports flexible echo times with a better tolerance of non-optimal TE combinations than the traditional algorithms.

The present method is highly robust. The predicted images have high fidelity to the ground truth images obtained using conventional water-fat separation methods. Furthermore, the predicted images are superior in several aspects, including mitigation of global and local water/fat swaps, and more complete separation of water and fat. In particular, metal induced artifacts are corrected, even when the training set lacks any examples with metal.

A deep neural network is employed to provide end-to-end mapping from dual-echo chemical shift encoded images and imaging parameters to the corresponding water/fat images. The ground truth water and fat images used for model training can be obtained using conventional approaches (e.g., projected power approach, IDEAL, VARPRO). For input to the network, both phase and magnitude of dual-echo images are used. Moreover, the values of critical imaging parameters (e.g., TEs used for dual-echo image acquisition) are preferably included as an additional network input.

In one aspect, the invention provides a method for magnetic resonance imaging, comprising: performing by an MRI scanner chemical shift encoded imaging to acquire complex dual-echo images; applying the complex dual-echo images and imaging parameters as input to a deep neural network to produce as output separate water-only and fat-only images; displaying or storing the separate water-only and fat-only images for diagnostic or therapeutic purposes; wherein the deep neural network is trained with ground truth water/fat images derived from chemical shift encoded MR images using a conventional water-fat separation algorithm such as projected power approach, IDEAL, or VARPRO; wherein performing chemical shift encoded imaging comprises performing an image acquisition with the MRI scanner via a spoiled-gradient echo sequence or a spin-echo sequence.

Preferably, performing chemical shift encoded imaging comprises using undersampling patterns such as Cartesian variable density Poisson disc sampling, cones acquisition, or radial acquisition.

Preferably, performing chemical shift encoded imaging comprises reconstructing the complex dual-echo images using parallel imaging and/or compressed sensing reconstruction approaches.

Preferably, the input to the deep neural network comprises both phase and magnitude of the complex dual-echo images.

Preferably, the imaging parameters include imaging parameters for water-fat separation that comprise TEs of dual-echo images.

Preferably, the deep neural network comprises a single deep neural network that produces water and fat images (as the outputs) with several 1×1 kernels at the last layer. Alternatively, the deep neural network comprises two deep neural networks for separate generation of water and fat images.

Preferably, the deep neural network is a modified U-Net that has a hierarchical network architecture with global shortcuts and densely connected local shortcuts; wherein at each hierarchical level, there are several convolutional blocks; wherein image features are extracted using 3×3 convolutional kernels, followed by a Parametric Rectified Linear Unit (PReLU).

Preferably, the deep neural network is trained using a loss function selected from conventional $l_1$, RMSE (root-of-mean-squared error), a mixed $l_1$-SSIM loss, perceptual loss, or other loss function in which physical models are integrated.

DETAILED DESCRIPTION OF THE INVENTION

Overview

Figure 1:
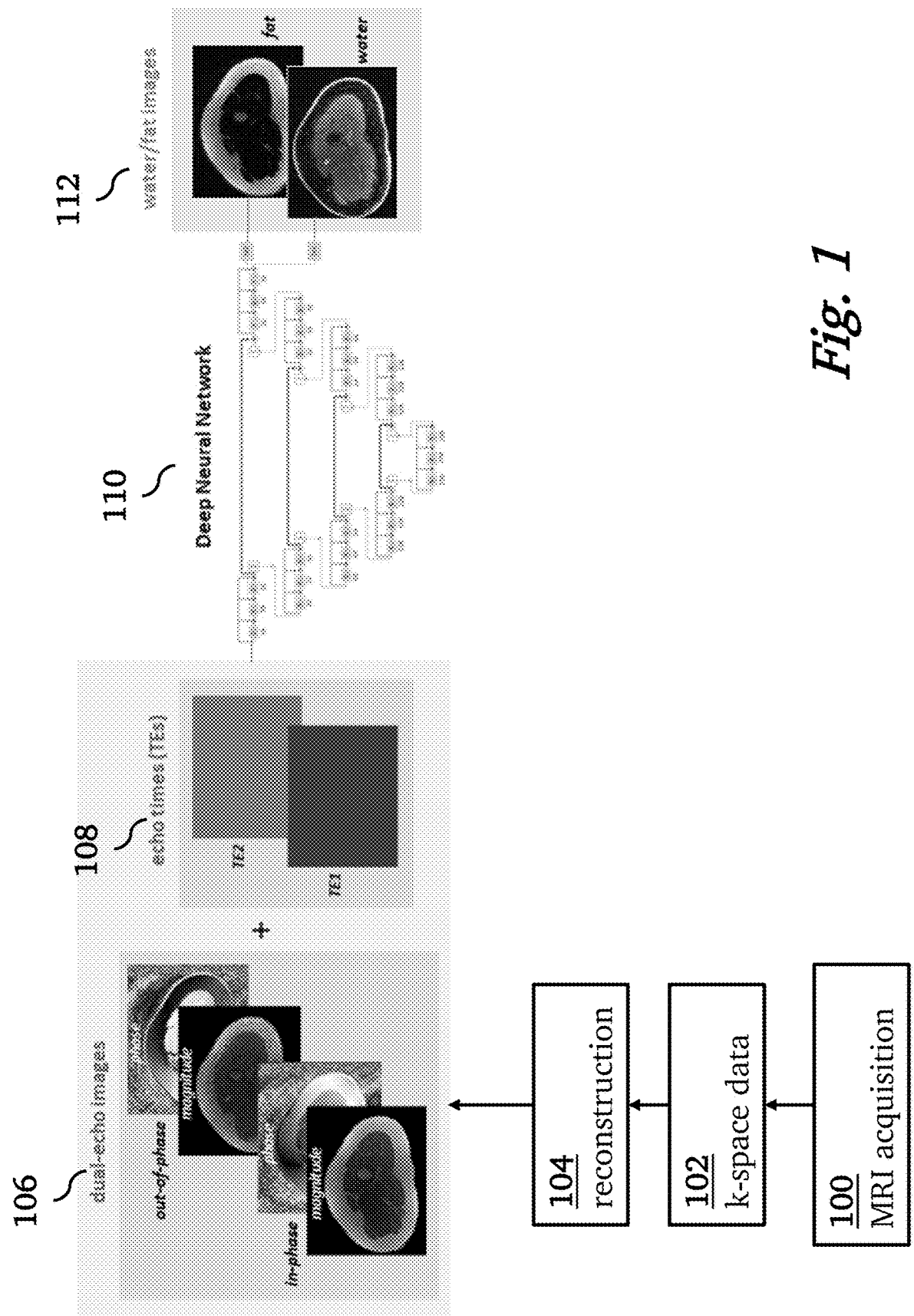
FIG. 1 is a schematic flow diagram illustrating a method for generating water-fat separation images using MRI and deep learning, according to an embodiment of the invention.

Described herein is a method for generating water-fat separation images using MRI and deep learning. As shown in FIG. 1, an MRI apparatus performs an MRI acquisition 100 to obtain k-space data 102. And MRI reconstruction 104 produces dual-echo chemical shift encoded images (both phase and magnitude) 106 from the k-space data 102. The complex dual-echo images 106 are input to a deep neural network 110 which outputs the corresponding water/fat images 112.

The deep neural network thus provides end-to-end mapping from the dual-echo images and imaging parameters to the corresponding water/fat images. As will be described later, the neural network 110 is trained using ground truth water/fat images produced from dual-echo images using the conventional projected power method (a robust binary quadratic optimization approach).

MRI Data Acquisition and Image Reconstruction

Chemical shift encoded dual-echo images 106 are reconstructed in step 104 from k-space data 102 using conventional parallel imaging or compressed sensing reconstruction approaches. The k-space data 102 is acquired by an MRI apparatus acquisition 100 via a spoiled-gradient echo sequence (with or without injection of contrast agent) or a spin-echo sequence. To accelerate data acquisition, undersampling patterns (e.g., Cartesian variable density Poisson disc sampling, cones acquisition, radial acquisition) can be used. Based upon prescribed image resolution and system gradient strength, there can be various choices of TEs, for example, a TE of 2.23 ms for in-phase images and different clusters of TE for out-of-phase images (minimal optimal TEs 1.21-1.31 ms or extended optimal TEs 3.35 ms). More flexible TEs (that deviate from optimal values of in-phase and out-of-phase TEs) can be adopted with the mechanism that includes imaging parameters as additional network input. Preferably, other imaging parameters are kept relatively consistent.

Generation of Ground Truth Water/Fat Images

A conventional water-fat separation imaging approach, projected power approach, is used to generate the ground truth images for training. It is an ideal candidate for generating the ground truth images from dual-echo images, because it is more robust than more routinely used algorithms and has relatively short postprocessing time (as compared to other methods, but still quite lengthy for practical clinical use).

Alternatively, IDEAL or VARPRO can be used to generate the ground truth images if three or more multi-echo chemical shift encoded images are available in the training phase. To establish the model, three or more multi-echo images are acquired for generating the ground truth water/fat images, only two images are used as the input to the deep neural network. In testing, only two chemical shift encoded images are acquired.

Deep Learning-Based Water-Fat Separation Model with Imaging Parameters Included as an Additional Network Input A deep neural network is employed to provide end-to-end mapping from complex dual-echo images to the corresponding water and fat images. Here, the ground truth or reference water/fat images are obtained using the projected power approach. As the input to the network, both magnitude and phase of dual-echo images are used. Moreover, the TEs used to acquire the dual-echo images are included as an additional input to support the use of flexible imaging parameters.

The method preferably incorporates the values of imaging parameters 108 as additional input to the deep neural network 110. While the signal intensity of an MRI image is influenced by the values of imaging parameters, what a common deep learning-based imaging model typically does is to learn the physical model only from input radiological images and ignore the values of imaging parameters. Even in self-supervised learning methods, the values of imaging parameters are used for loss calculation, but not directly used for output image generation as network input. Although water-fat separation can be accomplished using a common deep neural network without including the values of imaging parameters as network input, explicit provision of such a priori knowledge helps to improve the prediction accuracy (an example is shown in FIG. 6B).

Figure 10:
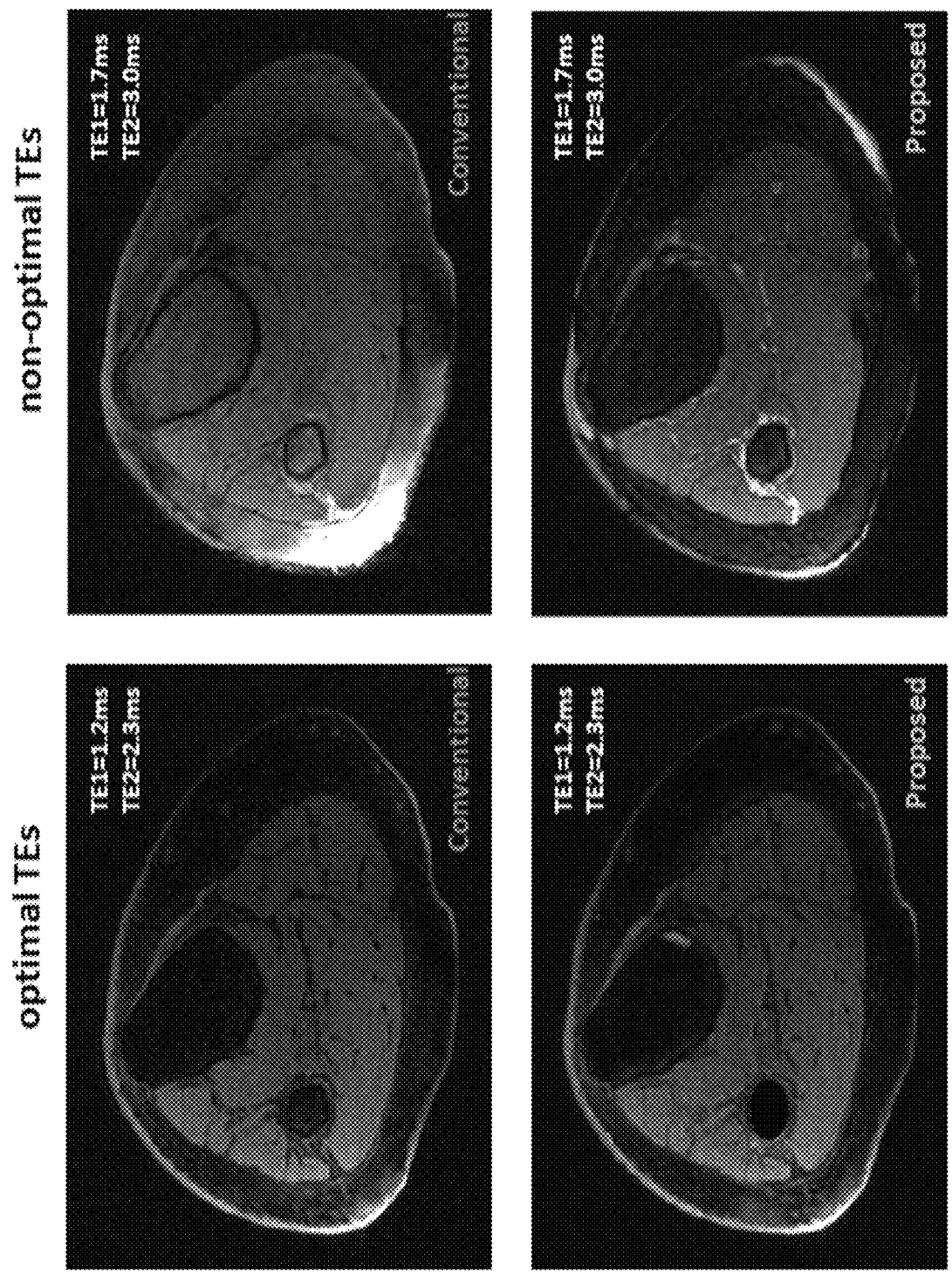
FIG. 10 shows water images derived from non-contrast enhanced dual-echo images acquired with optimal or non-optimal TEs, demonstrating that when TEs of dual-echo images deviate from the optimal values of in-phase and out-of-phase TEs, the deep learning method still works well.

Particularly important, the mechanism supports the use of flexible imaging parameters. For water-fat separation, dual-echo images acquired with non-optimal TEs (which deviate from the optimal values of in-phase and out-of-phase TEs) can be used. This has a potential to facilitate more efficient acquisition of high-resolution dual-echo images (an example is shown in FIG. 10).

In a preferred implementation, the input to the network includes not only dual-echo images, but also imaging parameters 108 in the form of corresponding TEs of dual-echo images at every pixel.

Network Architecture

The deep neural network 110 that performs the proposed image-to-image translation task may have different possible architectures to obtain both water and fat images. For example, two separate deep neural networks could be used in parallel, one generating water images and the other generating fat images. Alternatively, and preferably, the network 110 is a single deep neural network that simultaneously produces two outputs (water and fat images) with multiple 1×1 kernels at the last layer.

Figure 2:
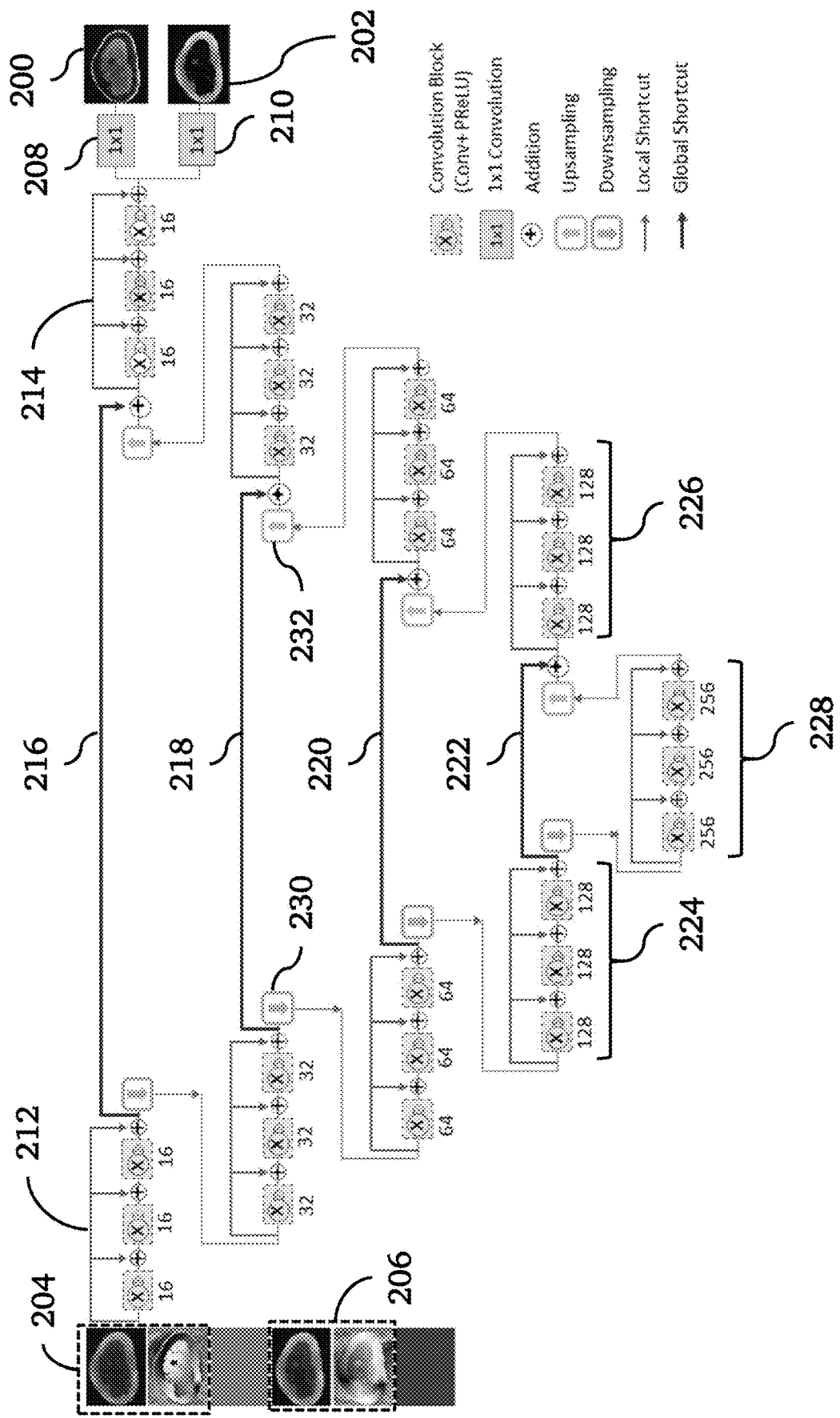
FIG. 2 is a schematic diagram illustrating the architecture of the single deep neural network that simultaneously derives water and fat images from dual-echo images, according to an embodiment of the invention.

The architecture of the single deep neural network is detailed in FIG. 2 is a densely connected hierarchical convolutional neural network that simultaneously derives two outputs (water and fat images, 200 and 202) from dual-echo images, 204 and 206. This network architecture is similar to T-Net except having two 1×1 kernels 208 and 210 at the last layer for the production of the two outputs, 200 and 202.

More specifically, T-Net is a variant of U-Net, which has a hierarchical network architecture with global shortcuts 216, 218, 220, 222 connecting ends of each layer and densely connected local shortcut connections (e.g., 212 and 214) within both ends of each layer. At each hierarchical level, there are several convolutional blocks, e.g., three blocks 228 at the deepest level, and at the second deepest level three blocks 224 at one end of the layer and three blocks 226 at the other end of the layer. In each block, image features are extracted using a 3×3 convolutional kernel followed by a Parametric Rectified Linear Unit (PReLU). Down-sampling blocks (e.g., 230) and up-sampling blocks (e.g., 232) are accomplished using 2×2 convolutional kernels with a stride of 2.

Network Training and Testing

We now describe an example illustrating the training and testing of the neural network. Contrast-enhanced images were acquired from 78 patients (21238 two dimensional images) using a preset imaging protocol with optimal TEs. This included 17424 images of the knee from 59 subjects, 1010 images of the ankle/foot from five subjects, 948 images of the arm from four subjects, and 1856 images of the hand from ten subjects.

With the application of 8-fold cross-validation, deep learned-based water-fat separation models were trained and tested on images of the knee. The established models were also tested on images of foot/ankle and arm.

Furthermore, comprehensive models were trained and tested for water-fat separation of hand images with 5-fold cross validation applied (hand cases are more challenging due to severe $B_0$ inhomogeneity; including hand images in training sets helps to improve the prediction accuracy).

Finally, non-contrast enhanced images were acquired from two volunteers using alternative imaging parameter values to investigate the model's capability to support flexible imaging parameters.

For training the network, a conventional $l_1$ or RMSE (root-of-mean-squared error) was employed as the loss function to train the network to predict water/fat images from the input data. Alternatively, a mixed $l_1$_SSIM loss, perceptual loss, or other loss function in which physical models are integrated can be used. In one implementation, the network parameters were updated using the Adam algorithm with a of 0.001, $\beta_1$ of 0.89, $\beta_2$ of 0.89, and $\epsilon$ of $10^{-8}$.

Examples and Results

Deep learning-based dual-echo water-fat separation models as described above were trained and tested. Using the proposed deep learning method, the data processing time required for a 2D image was substantially reduced, and high fidelity was achieved.

Contrast enhanced dual-echo images of the extremities were acquired using a 3D SPGR sequence. Based upon prescribed image resolution and system gradient strength, two cluster of opposed-phase TEs values were used (1.25-1.31 ms or 3.35 ms). Meanwhile, a TE of 2.23 ms was used to acquire in-phase images. Other imaging parameters were as follows: bandwidth=192 kHz, FOV=32×36 cm, matrix size=512×512, number of slices=292-440, slice thickness=1 mm, flip angle=15, scan time=2 min 48 sec-6 min 10 sec for a 3D image volume.

A total of 17424 contrast enhanced images of the knee from 59 consecutive patients were used for training and testing, with 8-fold cross validation strategy applied. In particular, two patients had metallic implants; and one data set was obtained on a 1.5 T scanner. The images acquired at 1.5 T with severe artifacts were excluded from the training sets. For the 8-fold cross validation, images acquired with different clusters of parameter values (TR, TE2) were included in every training set. Using the models trained with only knee data, images of the ankle/foot (1010 images from five subjects) and arm (948 images of the arm from four subjects) were also tested.

Furthermore, two non-contrast enhanced volunteer studies were performed to investigate the model's capability to support flexible imaging parameters. In the first study, several series of dual-echo images were acquired, each using a different imaging parameter (such as different acceleration factor, bandwidth, flip angle, phase encoding, or bad shimming for severely inhomogeneous $B_0$ field). In the second study, two series of dual-echo images were acquired, one using optimal TEs (1.2/2.3 ms) as the baseline, and the other using non-optimal TEs (1.7/3.0 ms). These non-contrast enhanced dual-echo images were tested on the models trained with only contrast enhanced images of the knee.

On average, the data processing time required for a 2D image was 0.13 seconds using deep learning, as compared to 1.5 seconds using the projected power approach (which had been significantly accelerated with the application of coil compression and downsampling/upsampling). For the average volumetric dataset with 400 slices, processing time was reduced from 10 minutes to under one minute.

Figure 3:
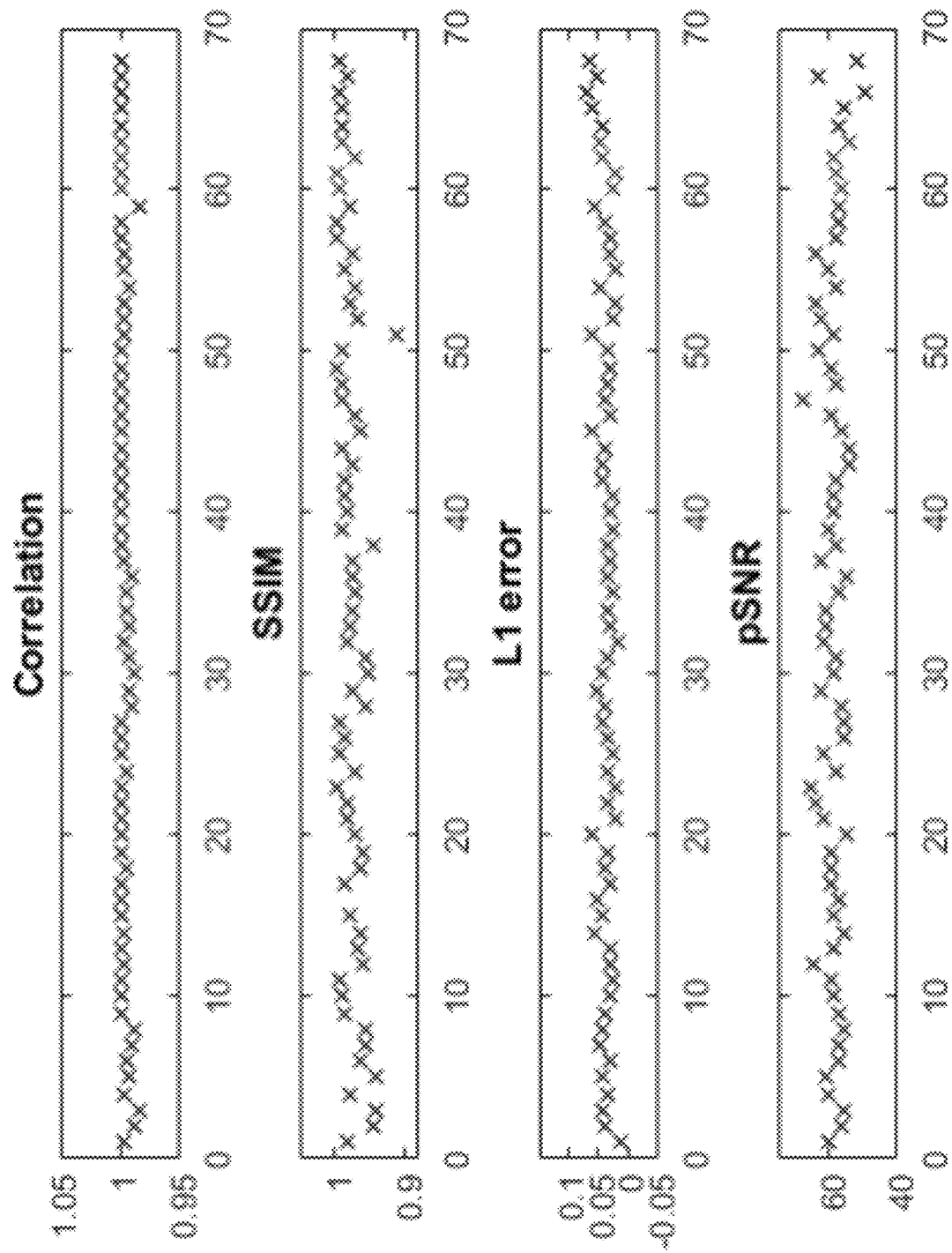
FIG. 3 shows graphs of correlation coefficient, SSIM, $l_1$ error and pSNR of predicted water images, according to an embodiment of the invention.

In terms of quantitative evaluation of accuracy of the methods, correlation coefficient, $l_1$ error, pSNR, and SSIM of the predicted water images of every subject are shown in FIG. 3. Using the models trained with only knee images, water-fat separation was performed on knee images from 59 subjects, foot/ankle images from 5 subjects, and arm images from 4 subjects. Overall, the correlation coefficient was between 0.9833 and 1.0000 with mean/std of 0.9969±0.0040, the $l_1$ error was between 0.0346 and 0.0648 with mean/std of 0.0381±0.0122, the SSIM was between 0.9994 and 1.0000 with mean/std of 0.9740±0.0207, and pSNR of 58.6876±3.2359 (metrics of the knee, arm, and foot/ankle images are marked with blue, red, and black, respectively). The scan performed at 1.5 T was excluded from quantitative evaluation because most of the reference images had severe water/fat swaps.

Figure 4A:
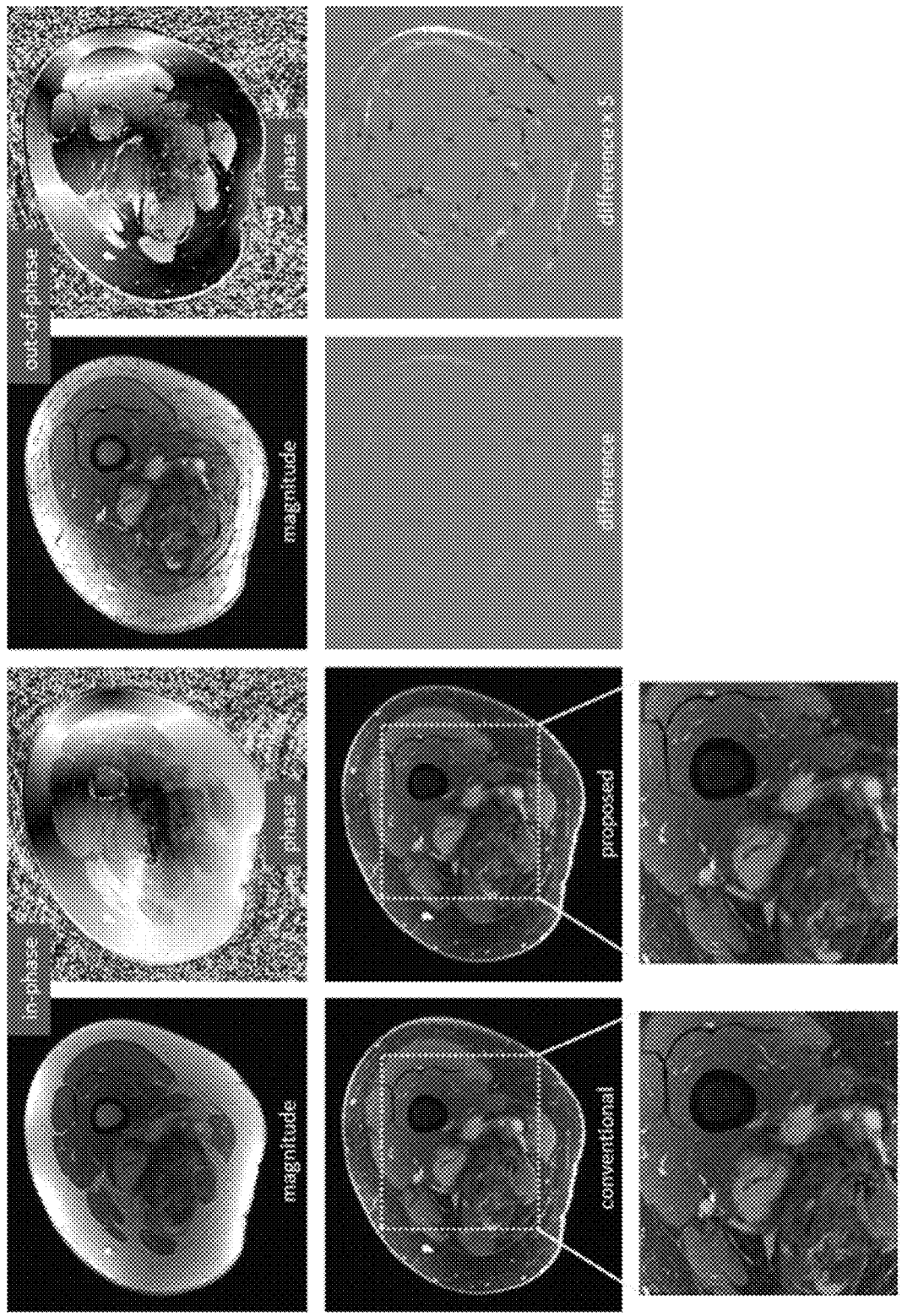
FIGS. 4A-4B show predicted water and fat images from dual-echo images compared to the ground truth images, according to an embodiment of the invention.
Figure 4B:
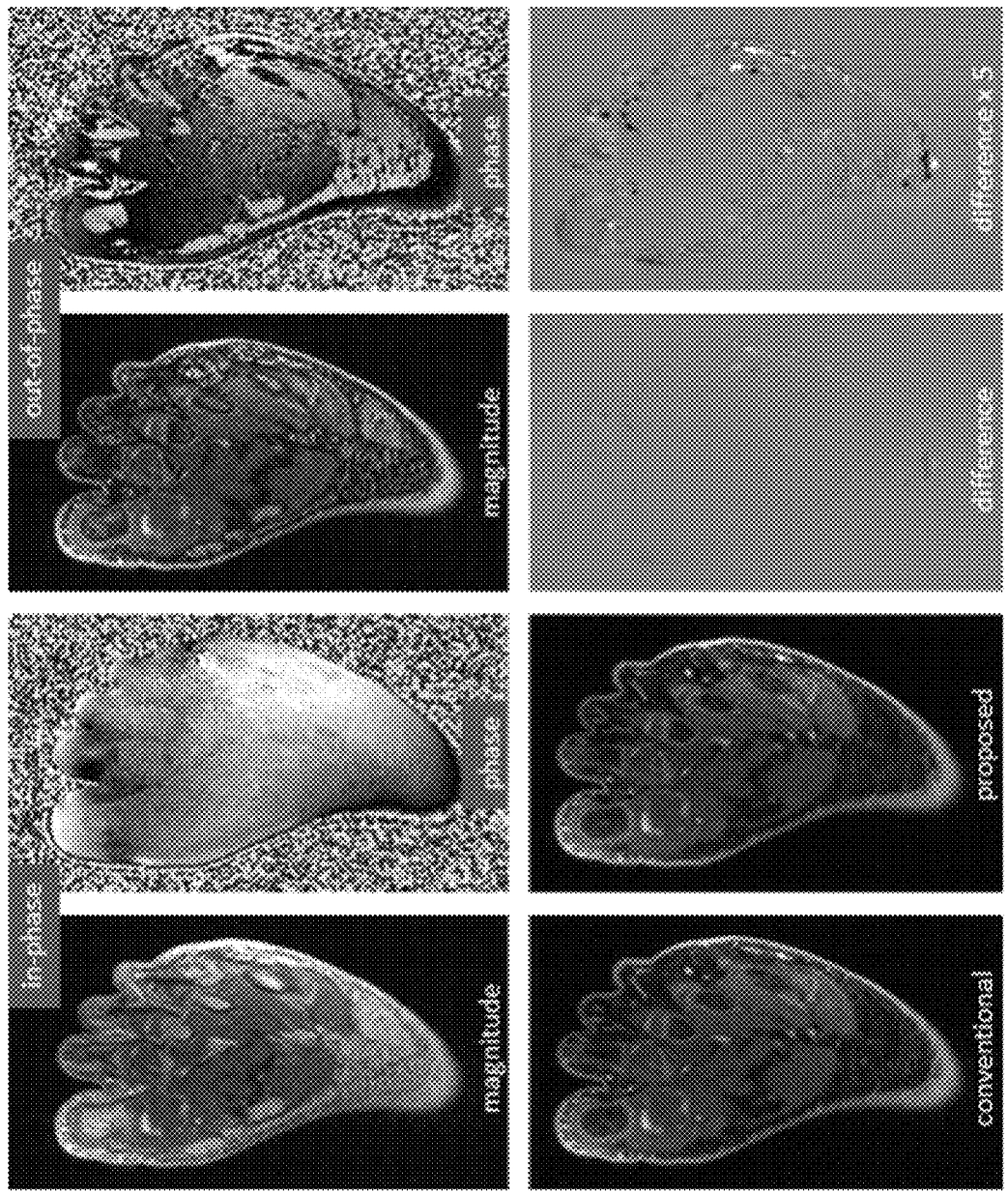

Using comprehensive models trained with both hand and knee images, we derived water/fat images of the hand from 10 subjects, where correlation coefficient was between 0.9772 and 1.0000 with mean/std of 0.9913±0.0055, $l_1$ error was between 0.0102 and 0.0203 with mean/std of 0.0270±0.0181, and SSIM is between 0.9522 and 0.9900 with mean/std of 0.9655±0.0154. Predicted water and fat images from dual-echo images had high fidelity relative to the ground truth images, as shown in FIGS. 4A-4B. As shown in FIG. 4A, highly accurate water images of the knee were predicted from magnitude and phase of the corresponding dual-echo images. The enhancing tumors (arrows) are well delineated. The upper row shows input images, including magnitude and phase of dual-echo images. The middle row displays water images with four columns corresponding to the ground truth, predicted images, difference images, and rescaled difference images (by a factor of 5), respectively. The lower row shows the zoomed cropped images of the ground truth and the prediction. The differences between the predicted images and the ground truth are negligible. The deep learning models trained with knee images work well on out-of-distribution data.

As demonstrated in FIG. 4B, foot images were accurately predicted as well. Using a deep learning model trained with only knee data, the predicted foot image has high fidelity to the ground truth image obtained using conventional approach, despite inference on a different anatomic region.

Figure 5A:
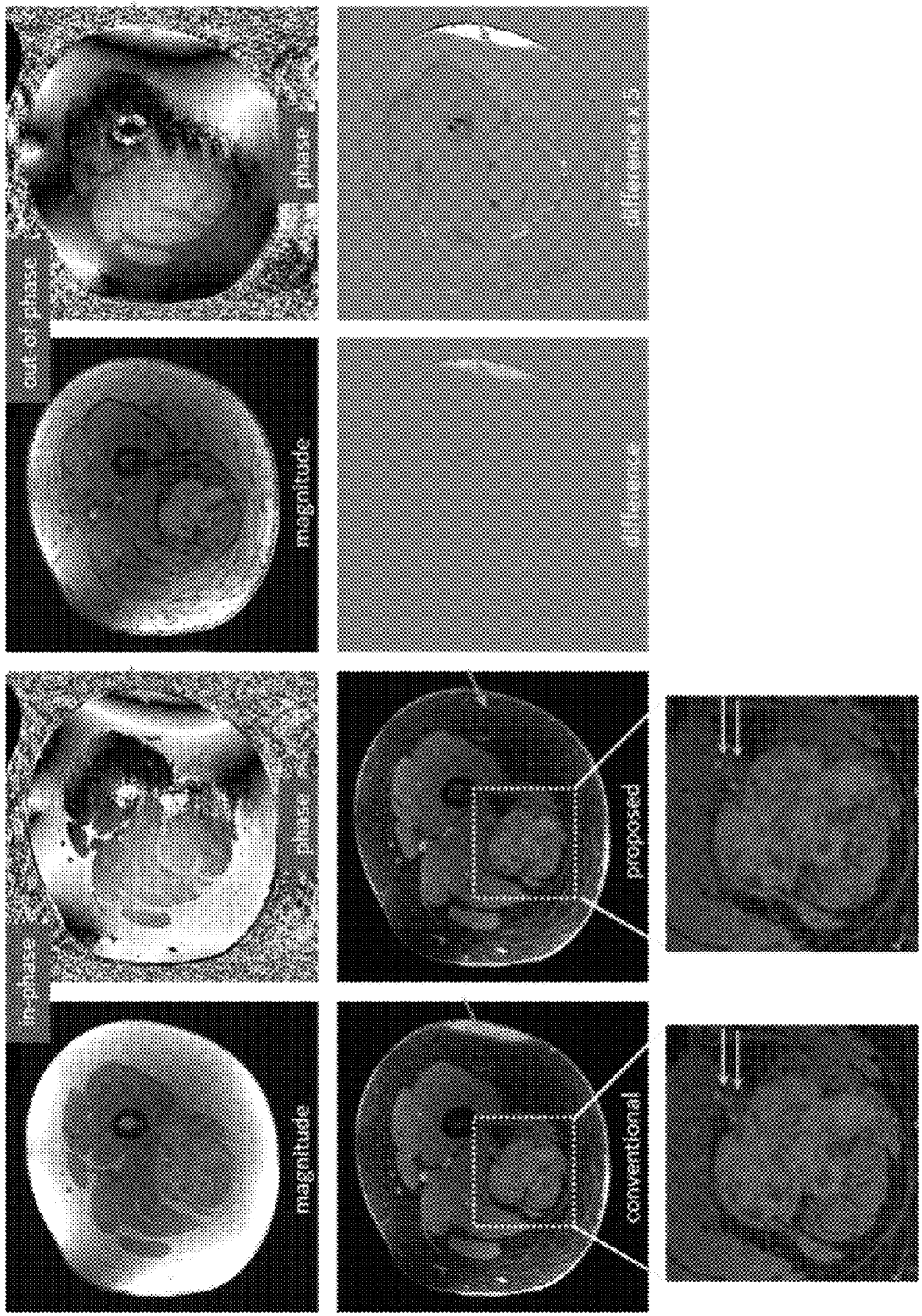
FIGS. 5A-5C show images illustrating correction of slight local water/fat swaps and global water/fat artifacts, according to an embodiment of the invention.
Figure 5B:
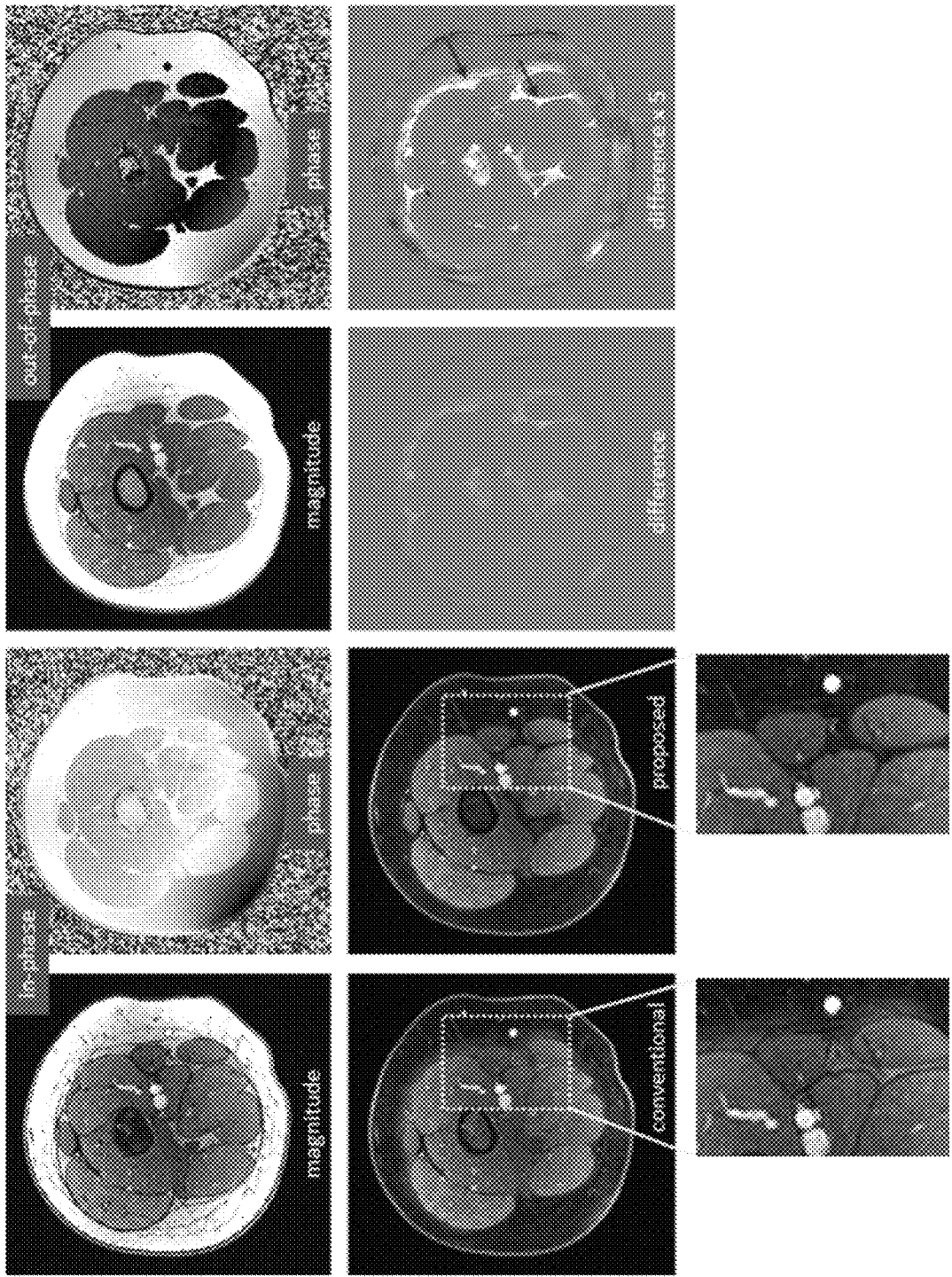
Figure 5C:
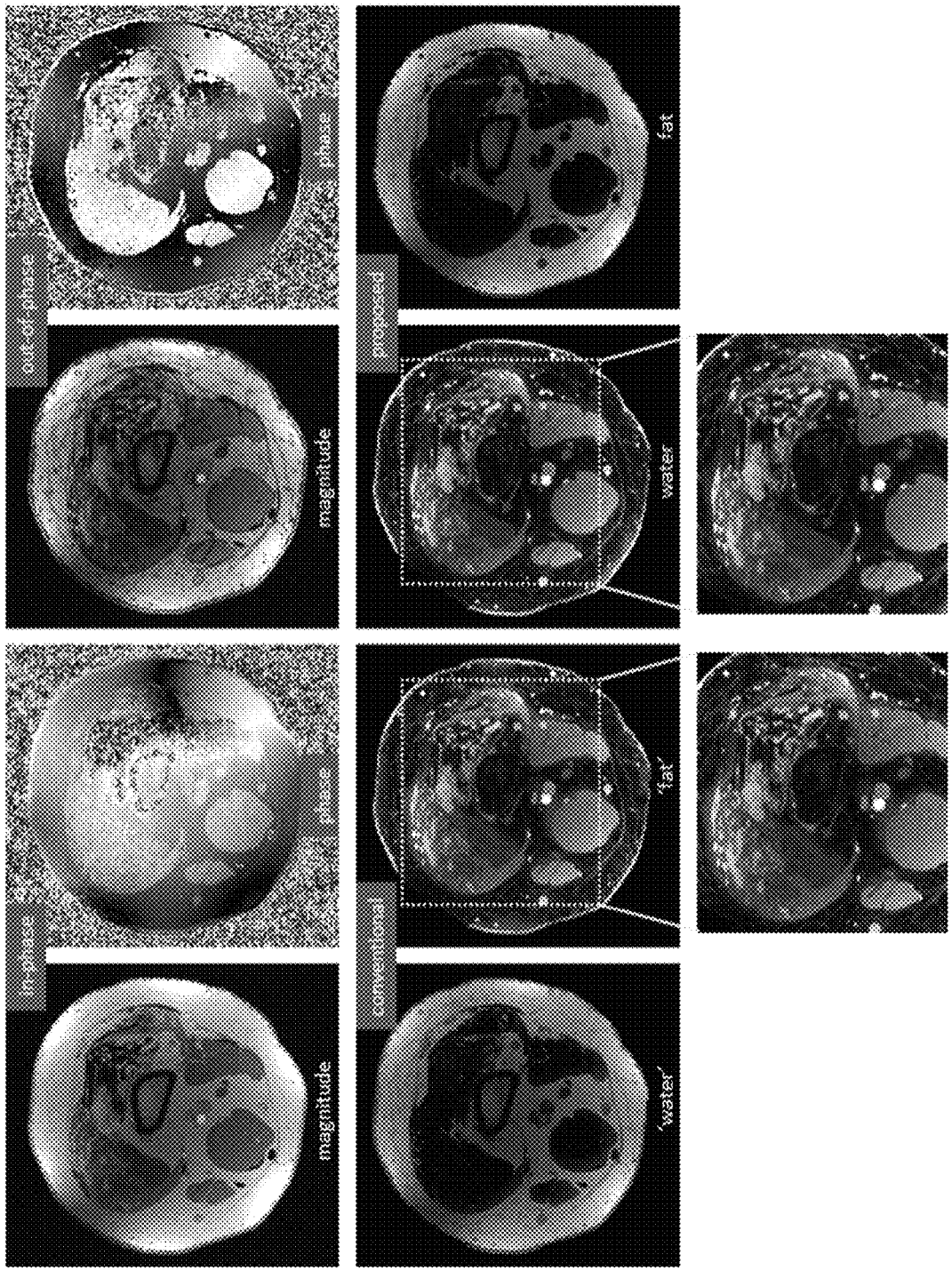

The present deep learning approach mitigates slight local water/fat swaps introduced by magnetic field inhomogeneities and eliminates global water/fat swaps. FIGS. 5A-5C illustrate correction of slight local water/fat swaps and global water/fat artifacts.

A representative example is shown in FIG. 5A. In this slice (far away from the isocenter), there are relatively severe magnetic field inhomogeneities, which can be inferred from the input phase images. While the $B_0$ inhomogeneities lead to artifacts in the ground truth water/fat images, the artifacts are absent in the predicted images. This demonstrates that artifacts in an off-isocenter ground truth image, which are introduced by $B_0$ inhomogeneities, are automatically compensated in the predicted images.

Further, as shown in FIG. 5B, more complete water-fat separation can be obtained in predicted images as compared to the ground truth image which has regions of error, indicating improved phase correction.

In FIG. 5C illustrates global water/fat swaps, which occur in the conventional projected power image, were eliminated using the deep learning method. Moreover, a slightly improved spatial resolution is observed in the predicted image.

The results also show that the deep learning method corrected severe water/fat swap errors in the ground truth images obtained using conventional methods.

Figure 6A:
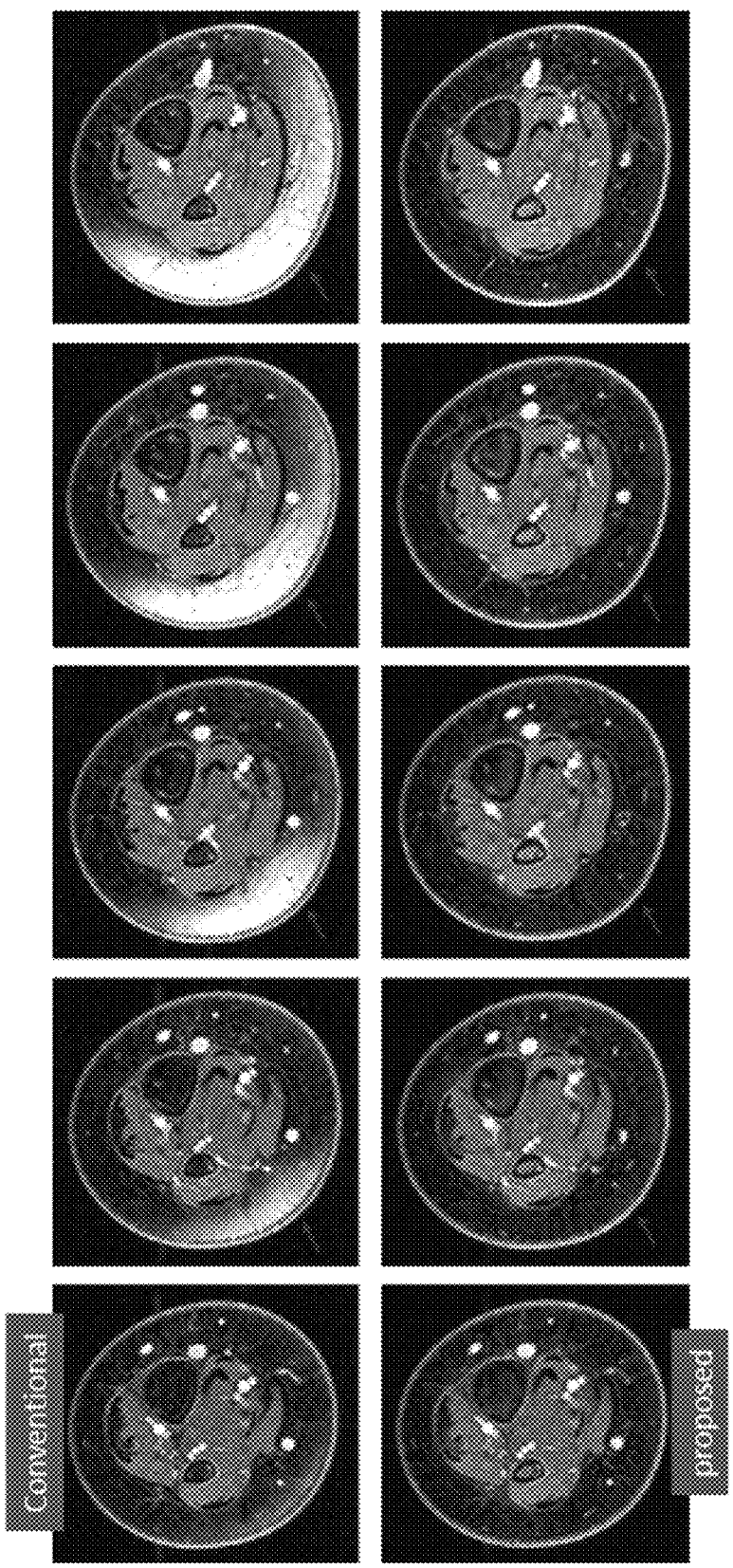
FIGS. 6A-6B show images illustrating how severe water/fat swaps generated by conventional methods are corrected in images generated by methods of the present invention.
Figure 6B:
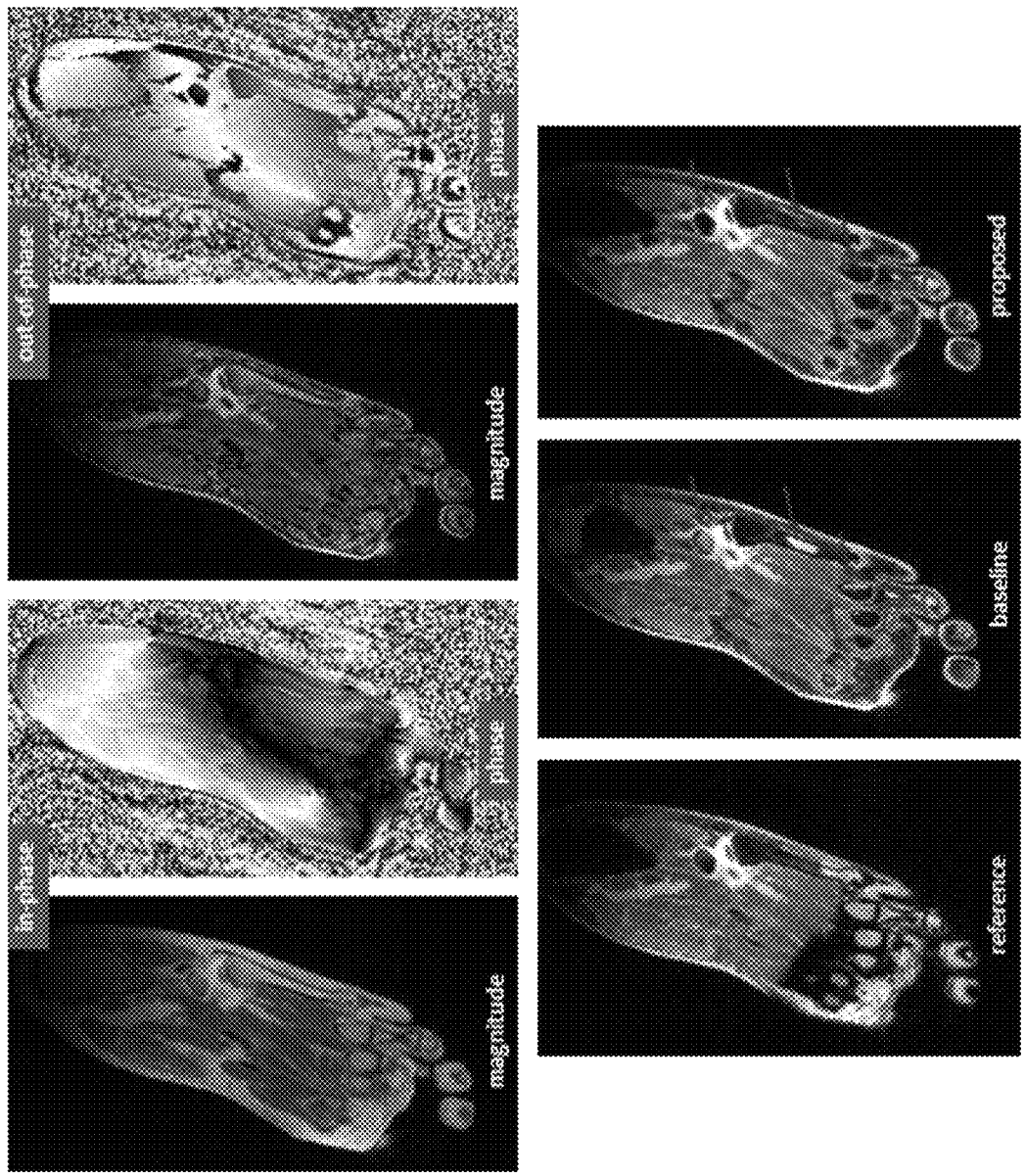

In an examination shown in FIG. 6A, when conventional method is applied, progressively severe water/fat swaps were present in the slices that get farther from isocenter (upper row). In the predicted images (lower row), the water/fat swaps were largely corrected.

In a foot examination shown in FIG. 6B, severe water/fat swaps were present in the images obtained using conventional method, where the dashed arrow points to an accessory ossicle with marrow edema, and a local swap appears in its marrow. The predicted images just have a few smaller swaps. The water/fat swaps are substantially compensated in the images derived from dual-echo images, which only have smaller regions of swaps (solid arrows). These remaining water-fat swaps are further mitigated in the image obtained from dual-echo images and corresponding TEs.

Figure 7A:
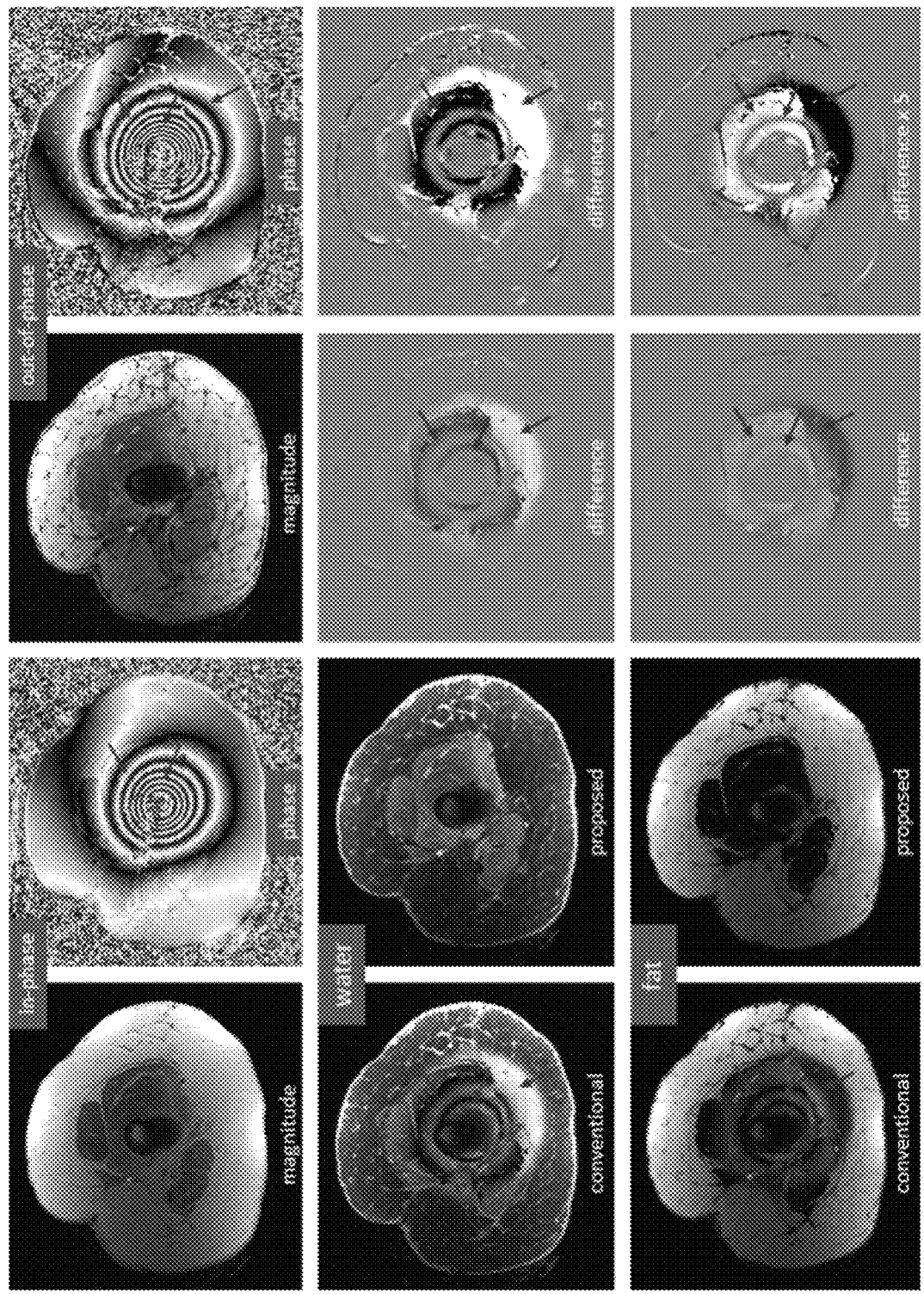
FIGS. 7A-7B show images illustrating how metal-induced artifacts generated by conventional methods are reduced in imaged generated by methods of the present invention.
Figure 7B:
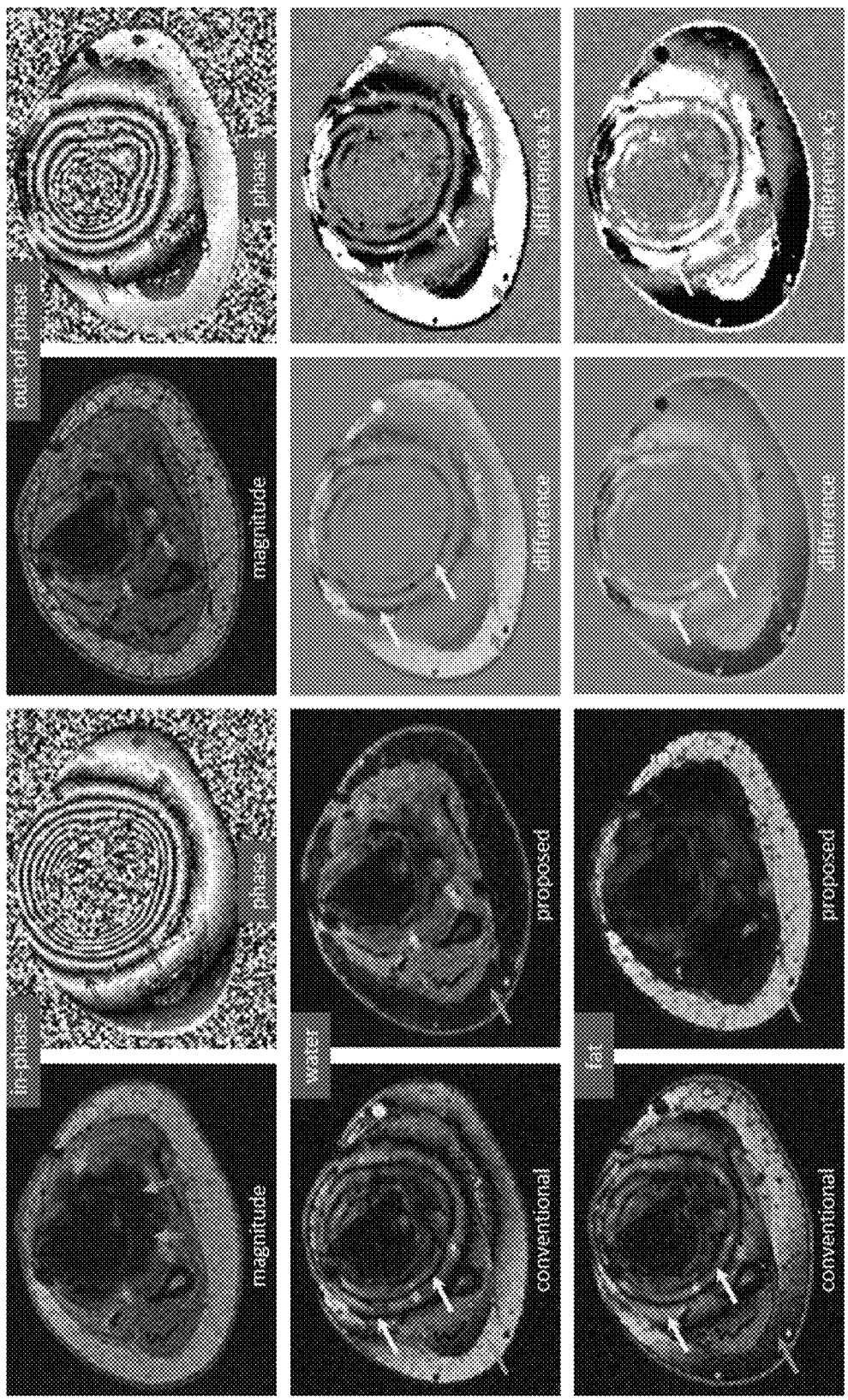

FIGS. 7A-7B illustrate marked reduction of metal-induced artifacts, where the training set lacks any examples with metallic implants. In the case shown in FIG. 7A, off-resonance artifacts are present in the ground truth images, since the local magnetic field near metal changes dramatically (as can be seen from the input phase images). In the predicted images, the metal-induced artifacts are largely corrected. This example illustrates robustness to out-of-distribution data, in this case a metallic object. Here, the local magnetic field near metal changes dramatically, making the cases with metallic implants very challenging in conventional approaches (since the assumption of smoothly varying magnetic field no longer holds). Severe artifacts appear in the ground truth water/fat images obtained when conventional approach was applied. Interestingly, the predicted images lack these artifacts. This can likely be attributed to an accurate estimation of $B_0$ map, which is implicitly performed as a critical step in the water-fat separation model. The deep learning-based $B_0$ estimation, as we believe, does not completely rely on the smoothly varying characteristics of magnetic field homogeneity (as conventional approaches do); instead, other a priori information is incorporated.

In FIG. 7B, an even more difficult case with metallic implants is demonstrated, where images of the ankle were acquired on a 1.5 T scanner. The substantial magnetic field inhomogeneity is not only reflected in the corruption in phase of the input images, but also present in the magnitude of the input images as significant signal loss, leading to apparent metal artifacts in the ground truth images. Meanwhile, severe water/fat swaps occur in this off-isocenter ankle slice. In the predicted images, these two categories of artifacts are simultaneously mitigated, even though the model was trained with only knee images acquired on 3 T scanners. Of note, in both cases, the training set lacked any examples with metallic implants.

Figure 8:
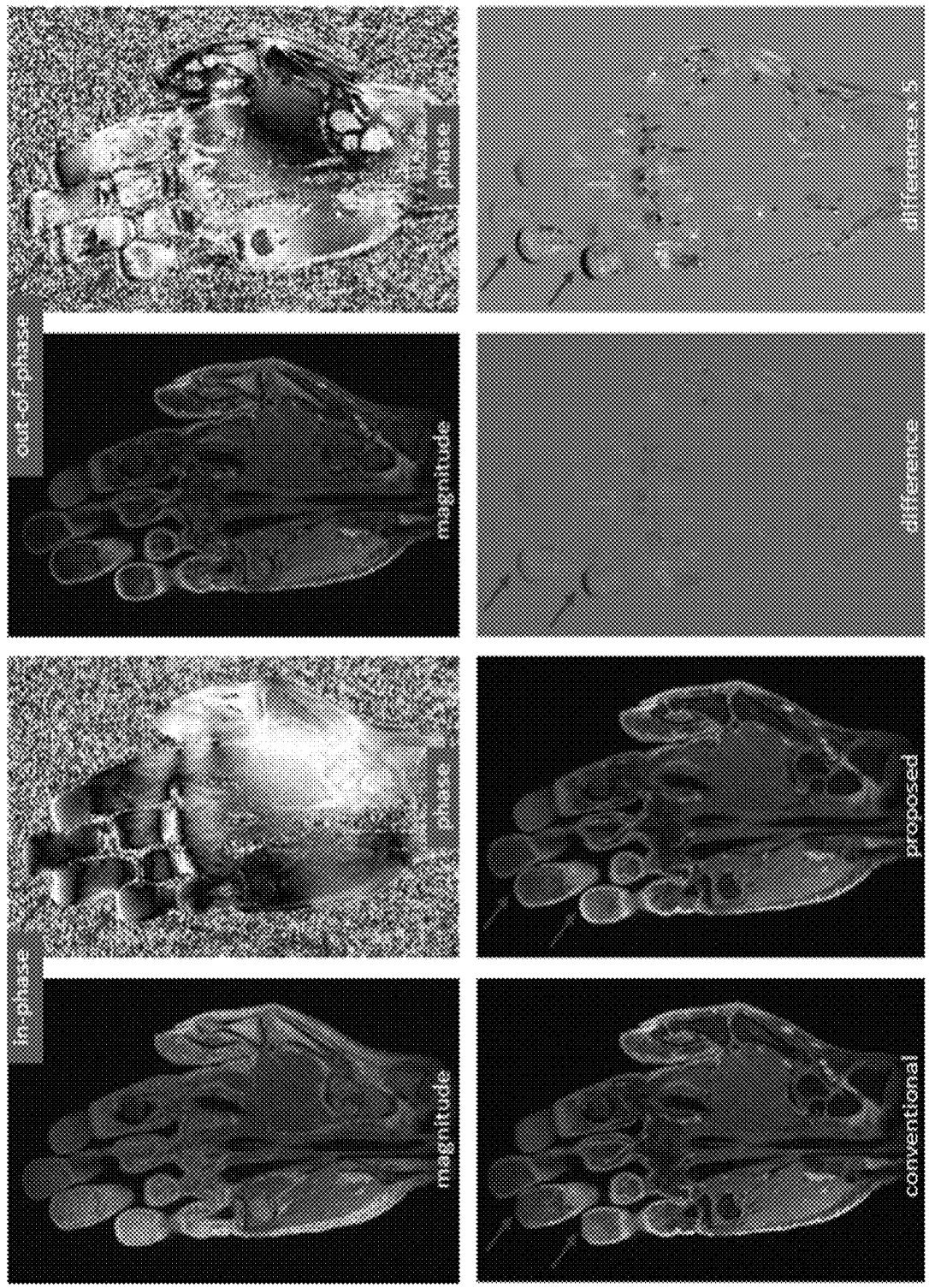
FIG. 8 shows contrast enhanced hand images illustrating improved water-fat separation in the hand using methods of the present invention compared to conventional methods.

An example of contrast enhanced hand images is demonstrated in FIG. 8. In general, water-fat separation in the hand is challenging due to relatively severe $B_0$ inhomogeneities. In this contrast enhanced study, the predicted image was improved over the reference image, particularly in the region of fingertips where $B_0$ inhomogeneities are more apparent. This confirms the advantage of deep learning in $B_0$ estimation.

Figure 9:
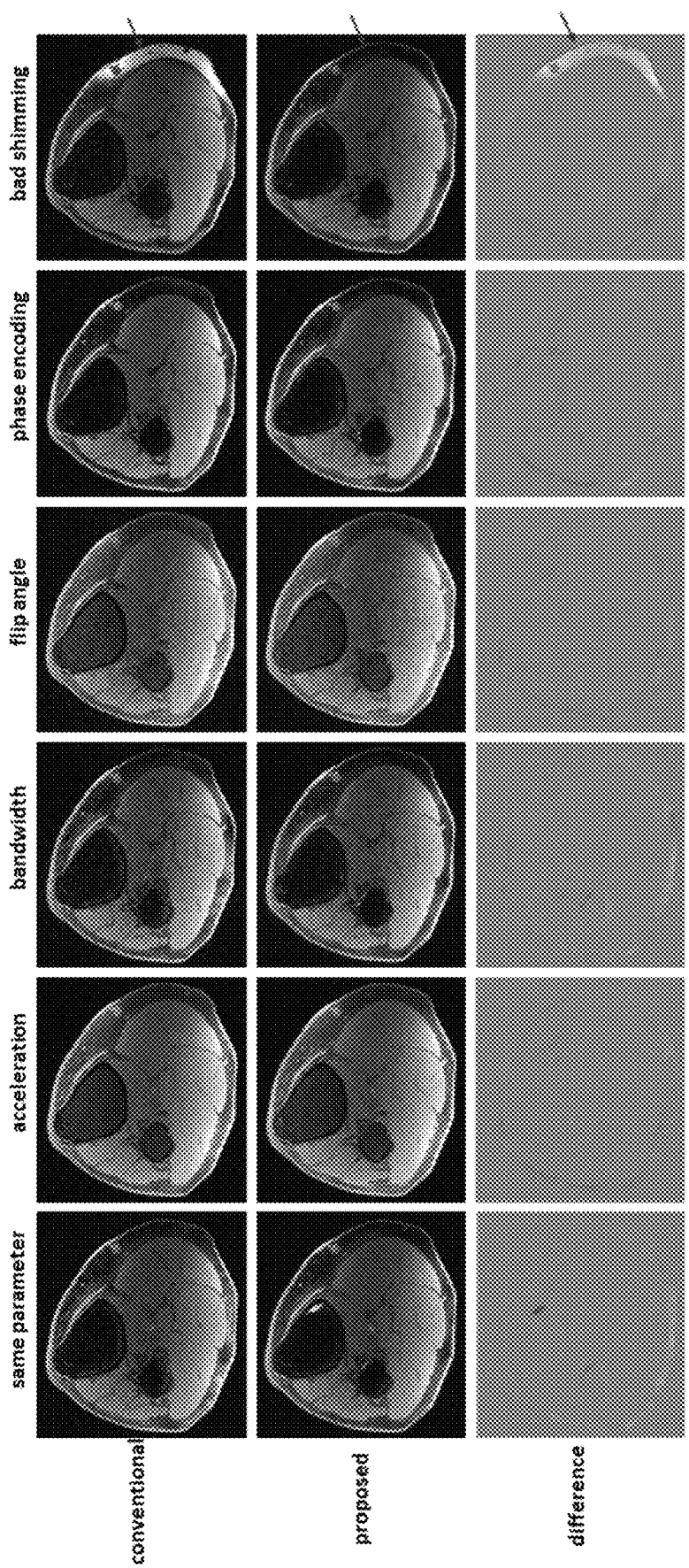
FIG. 9 shows images demonstrating the accuracy of images generated by methods of the present invention even when the imaging parameters of test images were different from those adopted in training sets.

Even if the imaging parameters of test images were different from those adopted in training sets, the predicted images were still accurate. In FIG. 9, water images derived from dual-echo images acquired with different imaging parameters (an acceleration factor of 2, bandwidth of 83.3 kHz, flip angle of 25°, or phase encoding of 224) were similar to the reference images. When bad shimming was intentionally imposed (to generate highly inhomogeneous $B_0$ field), water/fat swaps that occurred in reference images were corrected in the predicted images. The first column shows the same imaging parameters as those adopted in contrast enhanced studies, the second column shows images with an acceleration factor of 2, the third column shows images with bandwidth of 83.3 kHz, the fourth column shows images with flip angle of 25°, the fifth column shows phase encoding of 224. In these cases, the predicted images had high fidelity to the reference images. When bad shimming was intentionally imposed, water/fat swaps that occurred in the reference image were corrected in the predicted image, as shown in the sixth column. When TEs of dual-echo images deviate from the optimal values of in-phase and out-of-phase TEs, the deep learning method still works well. FIG. 10 shows water images derived from non-contrast enhanced dual-echo images acquired with optimal or non-optimal TEs. The first column shows that with the employment of the optimal TEs of 1.2/2.3 ms, water images derived using the deep learning model or conventional method are very similar. The second column shows that with the employment of non-optimal TEs of 1.7/3.0 ms, the conventional projected power method failed, whereas the deep learning method was significantly improved with only minor water/fat swaps appearing.

DISCUSSION

Dual-echo water-fat separation is highly desirable in clinical due to its high acquisition efficiency. In some anatomic regions, dual-echo imaging has been included as an essential part of the clinical imaging protocols, and water-fat separation can be achieved using the proposed method without acquisition of any additional echo.

The deep learning method described herein has the advantage of accurate estimate of $B_0$ map, which is otherwise challenging with limited echo numbers.

The proposed method maintained high accuracy with the use of flexible imaging parameters. Particularly interesting is the support to non-optimal TEs, which will facilitate more efficient acquisition of high-resolution images. This was made possible with the TEs incorporated as additional network input.

The employment of deep learning to derive water and fat information from dual-echo images has various advantages including mitigation of local water/fat swaps introduced by magnetic field inhomogeneity, elimination of global water/fat swaps, and correction of metal-induced artifacts in water and fat images.

The method has applications to use with MR scanners and in MRI-guided radiation therapy cancer treatment systems. Water/fat separation is critical across almost all applications of MRI: neurological, oncological (breast and body imaging), cardiovascular, musculoskeletal. Including the value of imaging parameters as additional input to deep neural network can be applied in a variety of radiology imaging modalities, such as Magnetic Resonance Imaging (MRI), Computed Tomography (CT), Ultrasound (US), Digital Subtraction Angiography (DSA). In MRI, it can be applied in other applications, such as quantitative parametric mapping.

Although the invention has been described with reference to various specific implementation details, those skilled in the art will appreciate that the principles of the invention are not limited to those details. For example, the inventors envision that the techniques of the invention may be implemented using supervised or self-supervised training. The techniques of the invention may be implemented using a different deep neural network architecture (e.g., convolutional neural network with attention mechanism, generative adversarial network, or pure attention network). The techniques of the invention may be implemented using a different loss function to train the network (e.g., a mixed $l_1$_SSIM loss, perceptual loss, or other loss function in which physical models are integrated). The techniques of the invention may be implemented using a different Dixon method to acquire ground truth water and fat images (e.g., IDEAL). The techniques of the invention may be implemented using different pulse sequence or imaging parameter values to acquire input images.

The techniques of the invention may be implemented using a different undersampling pattern to acquire input dual-echo images (e.g., cones acquisition, radial acquisition).

In self-supervised learning, we use the multi-output network (described earlier) to predict both magnitude and phase of water and fat images; given the predicted water and fat images, the dual-echo images can be calculated; and the loss function is the difference ($l_1$ loss, $l_1$_SSIM loss, RMSE loss, or perception loss) between the calculated and input dual-echo images; thus we no longer need 'ground truth' water and fat images for loss calculation, which otherwise would be derived from dual-echo images using a conventional water-fat separation approach (e.g., the projected power approach). The convolutional neural network with attention mechanism can be implemented by inserting an attention layer into every convolutional block such that the convolutional block is composed of three layers (convolution layer, attention layer, and nonlinear activation layer). $l_1$_SSIM is defined as $l_{1\_SIM} = l_1 + k(1-SSIM)$, where k determines the weighting between $l_1$ loss and SSIM loss.

The invention claimed is:

1. A method for magnetic resonance imaging, comprising:
performing by an MRI scanner chemical shift encoded imaging to acquire complex dual-echo images;
applying by the MRI scanner the complex dual-echo images and imaging parameters as input to a deep neural network to produce as output separate water-only and fat-only images;
storing and displaying by the MRI scanner the separate water-only and fat-only images for diagnostic or therapeutic purposes;
wherein the deep neural network is trained with ground truth water/fat images derived from chemical shift encoded images using a conventional water-fat separation algorithm;
wherein performing chemical shift encoded imaging comprises performing an image acquisition with the MRI scanner via a spoiled-gradient echo sequence or a spin-echo sequence.

2. The method of claim 1 wherein performing chemical shift encoded imaging comprises using undersampling patterns selected from the group consisting of Cartesian variable density Poisson disc sampling, cones acquisition, and radial acquisition.

3. The method of claim 1 wherein performing chemical shift encoded imaging comprises reconstructing the complex dual-echo images using parallel imaging and/or compressed sensing reconstruction approaches.

4. The method of claim 1 wherein the input to the deep neural network comprises both phase and magnitude of the complex dual-echo images.

5. The method of claim 1 wherein the imaging parameters include imaging parameters for water-fat separation that comprise TEs of dual-echo images.

6. The method of claim 1 wherein the deep neural network is trained using a loss function selected from conventional $l_1$, RMSE (root-of-mean-squared error), a mixed $l_1$-SSIM loss, perceptual loss, or other loss function in which physical models are integrated.

7. The method of claim 1 wherein the deep neural network comprises two deep neural networks that output the separate water and fat images.

8. The method of claim 1 wherein the deep neural network comprises a single deep neural network that produces both water and fat images as the outputs.

9. The method of claim 1 wherein the deep neural network is a modified U-Net that has a hierarchical network architecture with global shortcuts and densely connected local shortcuts; wherein at each hierarchical level, there are several convolutional blocks; wherein image features are extracted using 3×3 convolutional kernels, followed by a Parametric Rectified Linear Unit (PReLU).

* * * * *